(12) United States Patent
Ahn et al.

(10) Patent No.: US 10,658,549 B2
(45) Date of Patent: May 19, 2020

(54) UNIT SUBSTRATE FOR OPTICAL DEVICE AND OPTICAL DEVICE PACKAGE HAVING SAME

(71) Applicant: POINT ENGINEERING CO., LTD., Asan (KR)

(72) Inventors: Bum Mo Ahn, Suwon (KR); Seung Ho Park, Hwaseong (KR); Moon Hyun Kim, Ansan (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/144,857

(22) Filed: Sep. 27, 2018

(65) Prior Publication Data
US 2019/0097090 A1     Mar. 28, 2019

(30) Foreign Application Priority Data
Sep. 28, 2017   (KR) .......................... 10-2017-0126261

(51) Int. Cl.
*H01L 33/48*     (2010.01)
*H01L 33/58*     (2010.01)
*H01L 33/60*     (2010.01)

(52) U.S. Cl.
CPC .......... *H01L 33/483* (2013.01); *H01L 33/486* (2013.01); *H01L 33/58* (2013.01); *H01L 33/60* (2013.01); *H01L 2933/0033* (2013.01)

(58) Field of Classification Search
CPC .............................. H01L 33/483; H01L 33/58
USPC ........................................................ 257/99
See application file for complete search history.

(56) References Cited

U.S. PATENT DOCUMENTS

| | | | |
|---|---|---|---|
| 2007/0241362 A1* | 10/2007 | Han | H01L 33/62 257/100 |
| 2016/0380159 A1* | 12/2016 | Nam | H01L 33/483 257/99 |

FOREIGN PATENT DOCUMENTS

KR      10-1191363  B1     10/2012

* cited by examiner

*Primary Examiner* — Tong-Ho Kim

(57) ABSTRACT

Disclosed is a unit substrate for an optical device, the unit substrate including: an optical device-mounting region provided on an upper surface of the unit substrate; and first and second metal substrates bonded to each other with a vertical insulating layer interposed therebetween. A lower surface of the unit substrate is electrically connected to the mounting region, and side and upper surfaces of the unit substrate are electrically isolated from the mounting region such that an optical device is capable of operating in an environment with low electrical resistance.

10 Claims, 5 Drawing Sheets

UNIT SUBSTRATE FOR OPTICAL DEVICE AND OPTICAL DEVICE PACKAGE HAVING SAME

CROSS REFERENCE TO RELATED APPLICATION

The present application claims priority to Korean Patent Application No. 10-2017-0126261, filed Sep. 28, 2017, the entire contents of which is incorporated herein for all purposes by this reference.

BACKGROUND OF THE INVENTION

Field of the Invention

The present invention relates to a unit substrate for an optical device and an optical device package having the same. More particularly, the present invention relates to a unit substrate for an optical device and an optical device package having the same in which the optical device is capable of operating in an environment with low electrical resistance.

Description of the Related Art

An optical device package is an apparatus in which an array of optical elements is mounted to emit light. In this case, an optical device is an element that receives an electrical signal and emits light.

Among various optical devices, a light emitting diode (LED) emits light of high luminance as well as efficiency compared to existing optical devices, thus the LED is widely used in the display field.

LEDs can be divided into several types: visible light emitting diode (VR LED), infrared light emitting diode (IR LED), and ultraviolet light emitting diode (UV LED), according to the wavelength of light. An optical device package employing a UV LED (UV optical device) having a sterilization effect, which is a characteristic of ultraviolet rays, has been actively developed.

The above-mentioned UV optical device package is manufactured in which a UV optical device such as a UV LED is mounted on a unit substrate for an optical device.

An optical device package is disclosed in Korean Patent No. 10-1191363 (hereinafter, referred to as Patent Document 1).

The optical element device of Patent Document 1 includes: a substrate having a cavity; a light emitting chip disposed in the cavity of the substrate; a conductive wire electrically connecting the substrate and the light emitting chip; and an insulating layer electrically insulating the substrate.

However, the insulating layer of the optical element device of Patent Document 1 is interposed between two substrates to electrically insulate the two substrates.

Thus, when the optical element device is exposed to an environment with low electrical resistance such as underwater, electricity may be conducted to an exposed region of the substrate, i.e., the circumferential surface of the substrate. Accordingly, an electrical short is caused, and thus the light emitting chip electrically connected to the substrate is damaged.

DOCUMENTS OF RELATED ART (Patent Document 1) Korean Patent No. 10-1191363

SUMMARY OF THE INVENTION

Accordingly, the present invention has been made keeping in mind the above problems occurring in the related art, and an object of the present invention is to provide a unit substrate for an optical device and an optical device package having the same in which the optical device is capable of operating in low electrical resistance normally.

In order to achieve the above object, according to one aspect of the present invention, there is provided an unit substrate for an optical device, the unit substrate including: an optical device-mounting region provided on an upper surface of the unit substrate; and first and second metal substrates bonded to each other with a vertical insulating layer interposed therebetween, wherein a lower surface of the unit substrate is electrically connected to the mounting region, and side and upper surfaces of the unit substrate are electrically isolated from the mounting region.

In addition, an upper insulation portion may be provided at an upper portion of the unit substrate, and a side insulation portion may be provided at side surfaces of the unit substrate.

In addition, the upper insulation portion may be an insulating member bonded to upper surfaces of the first and second metal substrates.

In addition, the upper insulation portion may be a metal substrate bonded to upper surfaces of the first and second metal substrates with a horizontal insulating layer interposed therebetween.

In addition, the side insulation portion may be bonded to side surfaces of the first and second metal substrates and configured to overlap with the upper insulation portion.

In addition, the insulating member may be an insulation material filled in an accommodating portion configured along a peripheral surface of the unit substrate.

In order to achieve the above object, according to one aspect of the present invention, there is provided an optical device package including: an optical device mounted in a cavity; first and second metal substrates bonded to each other with a vertical insulating layer interposed therebetween; and a light transmitting member provided on the cavity, wherein a lower surface of the optical device package is electrically connected to the optical device, and side and upper surfaces of the optical device package are electrically isolated from the optical device.

In addition, the optical device may include a conductor electrically connecting the optical device and the first and second metal substrates across the vertical insulating layer. An upper surface of the optical device package may be insulated by an insulating member, which is bonded to upper surfaces of the first and second metal substrates and serves as an upper insulation portion. The optical device package may be provided with a side insulation portion at the side surfaces thereof, the side insulation portion being formed in which an insulation material is filled in an accommodating portion configured along a peripheral surface of the optical device package. The side insulation portion may be an insulating member configured to overlap with the upper insulation portion.

Furthermore, the side and upper surfaces of the unit substrate may be coated with an insulation material.

As described above, the unit substrate for the optical device and the optical device package having the same according to the present invention has the following effects.

Since the upper and side surfaces of the unit substrate for an optical device and the optical device package are provided with the upper insulation portion and the side insulation portion, it is possible to prevent an electrical short-circuit in an environment such as underwater environment.

In addition, in the unit substrate for an optical device and an optical device package, since the horizontal insulating layer is provided and the upper insulation portion is formed of a metal, it is possible to prevent degradation of reflection efficiency of an inclined surface of the cavity and it is advantageous in heat dissipation through the upper insulation portion. As a result, it is possible to prevent degradation of the efficiency of the optical device due to heat dissipation in an underwater environment.

In addition, since the upper surface of the unit substrate for an optical device and the optical device package is made of the insulating member, forming of the horizontal insulating layer is omitted such that the manufacturing process becomes efficient.

Furthermore, since the entire outer surface of the unit substrate for an optical device and the optical device package is coated with the insulation material, it is possible to achieve a waterproof structure.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, embodiments of the present invention will be described in detail with reference to the accompanying drawings.

A Unit Substrate 100 for an Optical Device According to a First Embodiment of the Present Invention Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to such specially listed exemplary embodiments and the conditions.

The above described objectives, features, and advantages will be more apparent through the following detailed description related to the accompanying drawings, and thus those of ordinary skill in the art may easily implement the technical spirit of the invention.

A unit substrate 100 for an optical device according to the first embodiment of the present invention and an optical device package 200 will be described with reference to FIGS. 1 to 4.

Figure 1:
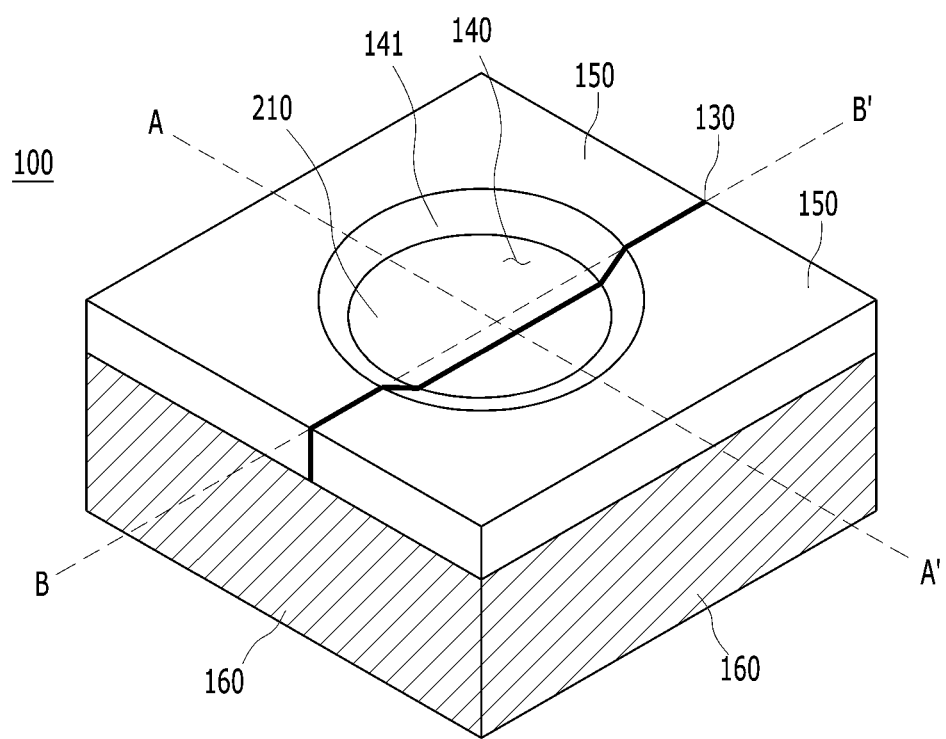
FIG. 1 is a perspective view illustrating a unit substrate for an optical device according to a first embodiment of the present invention.
Figure 2:
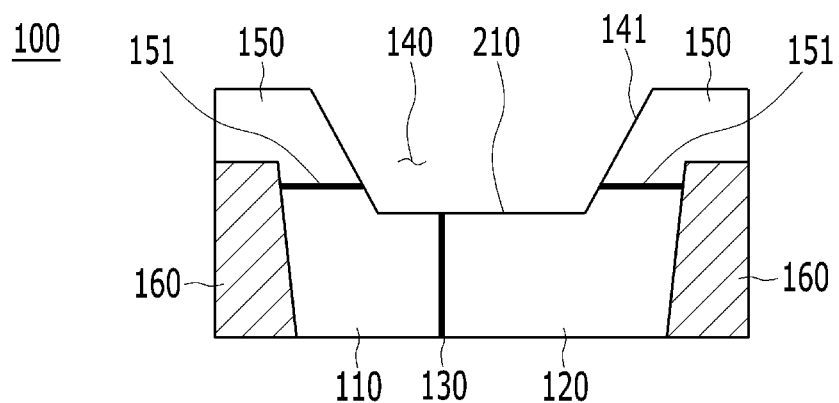
FIG. 2 is a cross-sectional view taken along line A-A' of FIG. 1.
Figure 3:
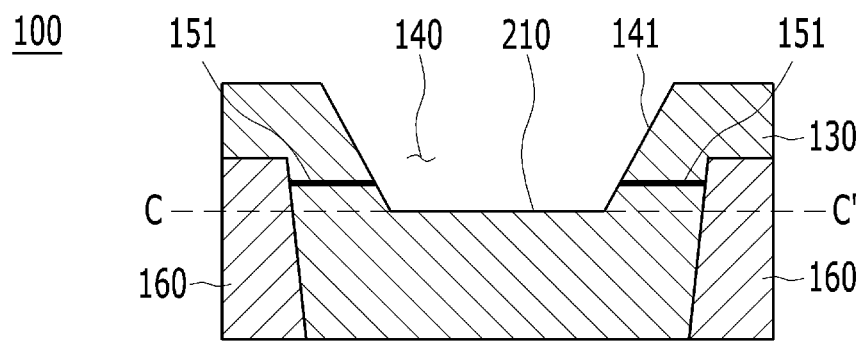
FIG. 3 is a cross-sectional view taken along line B-B' of FIG. 1.
Figure 4:
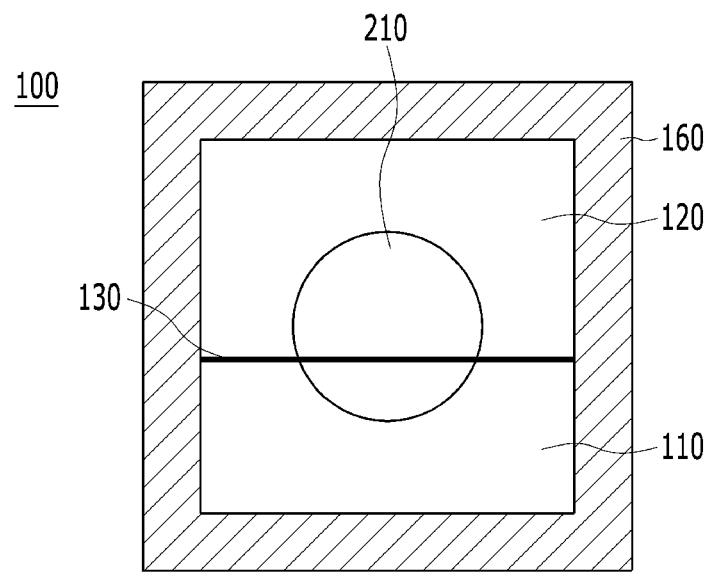
FIG. 4 is a cross-sectional view taken along line C-C' of FIG. 3.

FIG. 1 is a perspective view illustrating a unit substrate for an optical device according to a first embodiment of the present invention; FIG. 2 is a cross-sectional view taken along line A-A' of FIG. 1; FIG. 3 is a cross-sectional view taken along line B-B' of FIG. 1; and FIG. 4 is a cross-sectional view taken along line C-C' of FIG. 3.

As described in FIGS. 1 to 4, the unit substrate 100 for an optical device according to the first embodiment of the present invention includes: a vertical insulating layer 130 provided between first and second metal substrates 110 and 120 to electrically isolate the first and second metal substrates 110 and 120; an upper insulation portion 150 provided on an upper surface of the first and second metal substrates 110 and 120; a horizontal insulating layer 151 provided between the upper insulation portion 150 and the first and second metal substrates 110 and 120 to electrically isolate the upper insulation portion 150 and the first and second metal substrates 110 and 120; and a side insulation portion 160 configured along peripheral surfaces of the first and second metal substrates 110 and 120.

That is, the unit substrate 100 for an optical device includes the first metal substrate 110, the second metal substrate 120, the vertical insulating layer 130, a cavity 140, the upper insulation portion 150, the horizontal insulating layer 151, and the side insulation portion 160.

A right side surface of the first metal substrate 110 and a left side surface of the second metal substrate 120 are bonded to each other by the vertical insulating layer 130.

Thus, the first metal substrate 110, the vertical insulating layer 130, and the second metal substrate 120 are arranged in order from the left side to the right side.

The first metal substrate 110 and the second metal substrate 120 may be formed of a metal plate having excellent electrical conductivity. For example, the first metal substrate 110 and the second metal substrate 120 may be formed of a material selected from the group consisting of aluminum, an aluminum alloy, a copper alloy, iron, an iron alloy, and an equivalent material, but not limited thereto.

Lower surfaces of the first and second metal substrates 110 and 120 are electrically conductive.

The vertical insulating layer 130 is disposed vertically between the first metal substrate 110 and the second metal substrate 120. That is, the vertical insulating layer 130 is interposed between the first metal substrate 110 and the second metal substrate 120.

The vertical insulating layer 130 serves to isolate the first and second metal substrates 110 and 120 electrically and to bond the first and second metal substrates 110 and 120 together. Thus, the first and second metal substrates 110 and 120 are electrically isolated from each other by the vertical insulating layer 130, and thus electrodes of different polarity may be connected to the first and second metal substrates 110 and 120.

The cavity 140 including an optical device-mounting region 210 is provided on upper surfaces of the first and second metal substrates 110 and 120, which are bonded to each other by the vertical insulating layer 130 as described above.

The cavity 140 has a bowl shape whose width becomes narrower as it goes downward. Accordingly, the cavity 140 is provided with an inclined surface 141, and the inclined surface 141 is configured to be inclined from the outside toward the inside.

In other words, the cavity 140 is provided in a bowl shape, whereby a lower width of the cavity 140 is smaller than an upper width of the cavity 140.

The inclined surface 141 serves to reflect light emitted from an optical device 220.

The upper insulation portion 150 is located on the upper surfaces of the first and second metal substrates 110 and 120, and is isolated from the first and second metal substrates 110 and 120 by the horizontal insulating layer 151.

Specifically, the upper insulation portion 150 is attached on the upper surfaces of the first and second metal substrates 110 and 120 with the horizontal insulating layer 151 interposed therebetween.

Accordingly, the first and second metal substrates 110 and 120 and the upper insulation portion 150 are not electrically connected to each other.

As the first and second metal substrates 110 and 120, the upper insulation portion 150 may be formed of a material selected from the group consisting of aluminum, an aluminum alloy, a copper alloy, iron, an iron alloy, and an equivalent material.

Since the horizontal insulating layer 151 is provided for electrical insulation, an electrical short-circuit does not occur even though the upper insulation portion 150 is made of a metal member.

The horizontal insulating layer 151 is provided between the first and second metal substrates 110 and 120 and the upper insulation portion 150 to electrically isolate the first and second metal substrates 110 and 120 and the upper insulation portion 150, specifically, isolate the upper insulation portion 150 from the first and second metal substrates 110 and 120.

In other words, the horizontal insulating layer 151 is interposed between the upper insulation portion 150 and the first and second metal substrates 110 and 120, whereby the first and second metal substrates 110 and 120 and the upper insulation portion 150 are electrically isolated from each other.

It is preferable that a bottom surface of the horizontal insulating layer 151 is positioned higher than a bottom surface of the cavity 140. The bottom surface of the horizontal insulating layer 151 is required to be positioned higher than the bottom surface of the cavity 140 on which the optical device 220 is mounted in order to prevent an electrical short-circuit of the upper insulation portion 150 and the first and second metal substrates 110 and 120 in the underwater environment.

The horizontal insulating layer 151 is not configured on a region where the cavity 140 is configured. This is because the cavity 140 is configured partly occupying the regions of the first and second metal substrates 110 and 120, the upper insulation portion 150, and the horizontal insulating layer 151.

The side insulation portion 160 is configured along the peripheral surfaces of the first and second metal substrates 110 and 120, and serves to isolate the first and second metal substrates 110 and 120 from the outside.

Since the side insulation portion 160 is configured along the peripheral surfaces of the first and second metal substrates 110 and 120, the side insulation portion 160 has a structure formed along a peripheral surface of the unit substrate 100 for an optical device.

The side insulation portion 160 may include: an accommodating portion (not shown) configured along the peripheral surfaces of the first and second metal substrates 110 and 120, i.e., the peripheral surface of the unit substrate 100 for an optical device; and an insulation material filled in the accommodating portion.

The accommodating portion is configured along the peripheral surfaces of the first and second metal substrates 110 and 120 and overlaps with the upper insulation portion 150.

Since the side insulation portion 160 is configured with the accommodating portion and the insulation material filled in the accommodating portion and the filling groove, it is possible to form the side insulation portion with respect to thickness and shape thereof without limits.

The unit substrate 100 for an optical device blocks electricity flowing into the first and second metal substrates 110 and 120 except the lower surfaces of the first and second metal substrates 110 and 120 due to the upper insulation portion 150 and the side insulation portion 160.

In other words, the electricity, which flows into the optical device-mounting region 210 provided on the upper surfaces of the first and second metal substrates 110 and 120 in the cavity 140 from the upper and side surfaces of the first and second metal substrates 110 and 120, is blocked such that an electrical short-circuit that may occur when the electricity is introduced is prevented.

Specifically, the first and second metal substrates 110 and 120 are horizontally bonded to each other by the vertical insulating layer 130. Then, as the optical device 220 mounted on the optical device-mounting region 210 is electrically connected to the first and second metal substrates 110 and 120, the first and second metal substrates 110 and 120 serve as paths for applying voltage.

Here, the opposite electrodes are connected to the lower surfaces of the first and second metal substrates 110 and 120 respectively to be electrically conductive. Although the first and second metal substrates 110 and 120 are electrically insulated by the vertical insulating layer 130, when exposed to an environment in which electricity can flow from the side and upper surfaces thereof, i.e., an environment in which moisture exists, it is impossible for the vertical insulating layer 130 alone to block electricity flowing from the upper and side surfaces of the first and second metal substrates 110 and 120.

Therefore, as described above, the horizontal insulating layer 151, which is interposed between the upper insulation portion 150 and the first and second metal substrates 110 and 120, and the side insulation portion 160, which is configured along the peripheral surfaces of the first and second metal substrates 110 and 120, are provided such that the horizontal insulating layer 151 and the side insulation portion 160 serve to block the electricity flowing from the upper and side surfaces of the first and second metal substrates 110 and 120, thereby preventing an electrical short-circuit that may occur in the unit substrate 100 for an optical device.

In addition, since the upper insulation portion 150 is formed of a metal material, it is possible to prevent reflection efficiency of the inclined surface of the cavity 140 from degrading and it is advantageous in heat dissipation through the upper surface insulation part 150. As a result, it is possible to prevent degradation of the efficiency of the optical device 220 due to heat dissipation in an underwater environment.

An Optical Device Package 200 According to the First Embodiment of the Present Invention Hereinbelow, an optical device package 200 having the unit substrate 100 for an optical device according to the first embodiment of the present invention will be described according to an embodiment of the present invention with reference to FIG. 5.

The same elements may be substituted for the foregoing description, and redundant descriptions are omitted.

Figure 5:
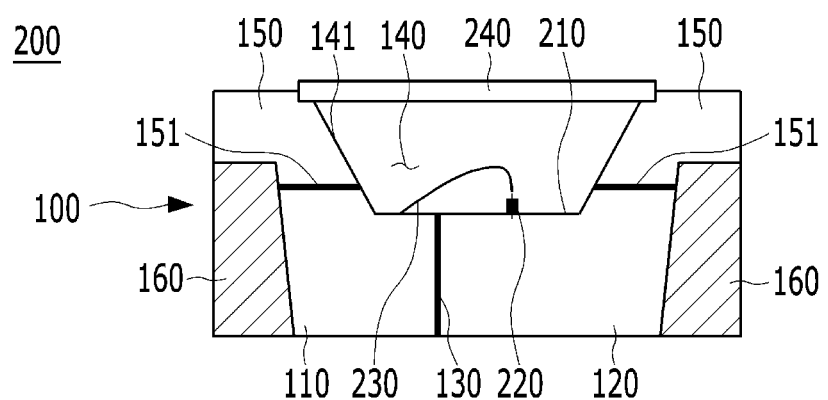
FIG. 5 is a cross-sectional view illustrating an optical device package in which an optical element and a light transmitting member are provided on the unit substrate for an optical device of FIG. 2.

FIG. 5 is a cross-sectional view illustrating an optical device package in which an optical element and a light transmitting member are provided on the unit substrate for an optical device of FIG. 2.

As shown in FIG. 5, the optical device package 200 includes: a unit substrate 100 for an optical device in which side surfaces of first and second metal substrates 110 and 120 are attached, a vertical insulating layer 130 is provided at a junction of the first and second metal substrates 110 and 120, and an upper insulation portion 150 and a side insulation portion 160 are provided on upper and side surfaces respectively; an optical device 220 mounted on the unit substrate 100 for an optical device; and a light transmitting member 240 provided on an upper portion of the unit substrate 100 for an optical device.

The optical device 220 is mounted on the cavity 140 of the unit substrate 100 for an optical device and illuminates by receiving voltage, thereby functioning as a luminous element of the optical device 220.

The optical device 220 may be a conventional light emitting diode (LED), but the present invention is not limited types of the optical device 220.

The optical device 220 is disposed on the top of the first metal substrate 110 which is one of the first and second metal substrates 110 and 120 to be electrically connected with each other, and connected to the second metal substrate 120 by a conductor 230 such that two different electrodes are connected thereto.

Alternatively, the optical device 220 may be connected to the first and second metal substrates 110 and 120 by using flip-chip bonding technique according to terminal positions of the optical device 220, or by using two conductors 230.

The first and second metal substrates 110 and 120 are electrically connected to a circuit board (not shown) in which the first metal substrate 110 and the second metal substrate 120 are electrically connected to opposite electrodes.

For example, the first metal substrate 110 is connected to a positive electrode and the second metal substrate 120 is connected to a negative electrode.

In this case, since the first and second metal substrates 110 and 120 are electrically isolated from each other by the vertical insulating layer 130, the optical device 220 is electrically connected to a positive electrode through one of the first and second metal substrates 110 and 120 and connected to a negative electrode through a remaining metal substrate and the conductor 230.

Accordingly, the optical device 220 is connected to positive and negative electrodes such that the optical device 220 can emit light due to electric energy from the electrodes.

The light emitted from the optical device 220 is reflected by the inclined surface 141 of the cavity 140.

The light transmitting member 240 is provided on the upper portion of the unit substrate 100 for an optical device, and serves to protect the optical device 220 mounted on the cavity 140 by covering the cavity 140 and transmit light emitted from the optical device 220.

The light transmitting member 240 may be made of a transparent member such as glass or quartz glass.

As the light transmitting member 240 is provided on the unit substrate 100 for an optical device and blocks the cavity 140 from the external environment, it is possible for the light transmitting member 240 to serve to protect the optical device 220 from the external environment.

In addition, since light emitted from the optical device 220 is reflected by the inclined surface 141 of the cavity 140 and transmitted by the light transmitting member 240, it is possible to minimize optical loss of the optical device 220.

A Unit Substrate 100' for an Optical Device According to a Second Embodiment of the Present Invention Hereinbelow, a unit substrate 100' for an optical device according to a second embodiment of the present invention will be described with reference to FIG. 6.

Figure 6:
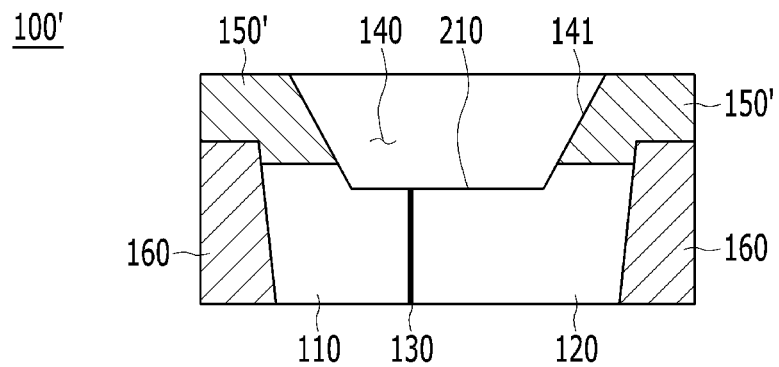
FIG. 6 is a cross-sectional view illustrating a unit substrate for an optical device according to a second embodiment of the present invention.

FIG. 6 is a cross-sectional view illustrating a unit substrate for an optical device according to the second embodiment of the present invention.

As shown in FIG. 6, the unit substrate 100' for an optical device according to the second embodiment of the present invention differs only in a shape of an upper insulation portion 150', and remaining components are the same as those of the unit substrate 100 of the first embodiment of the present invention.

Thus, same elements may be substituted for the foregoing description, and redundant descriptions are omitted.

The upper insulation portion 150' is made of an insulating member bonded to the upper surfaces of the first and second metal substrates 110 and 120.

In other words, the upper insulation portion 150' is an insulating member bonded to the upper surfaces of the first and second metal substrates 110 and 120, and is configured on the upper portion of the unit substrate 100 for an optical device.

The cavity is configured in a range including the first and second metal substrates 110 and 120 that are bonded to the upper insulation portion 150'.

That is, it is preferable that a bottom surface of the upper insulation portion 150' is positioned higher than the bottom surface of the cavity 140. The bottom surface of the upper insulation portion 150' is required to be positioned higher than the bottom surface of the cavity 140 on which the optical device 220 is mounted in order to prevent an electrical short-circuit of the upper insulation portion 150 and the first and second metal substrates 110 and 120 in the underwater environment.

As described above, in the unit substrate 100' for an optical device according to the second preferred embodiment of the present invention, a horizontal insulating layer 151 formed on the first and second metal substrates 110 and 120 is omitted whereby a manufacturing process can be efficient.

A Unit Substrate 100" for an Optical Device According to a Third Embodiment of the Present Invention Hereinbelow, a unit substrate 100" for an optical device according to a third embodiment of the present invention will be described with reference to FIGS. 7 and 8.

Figure 7:
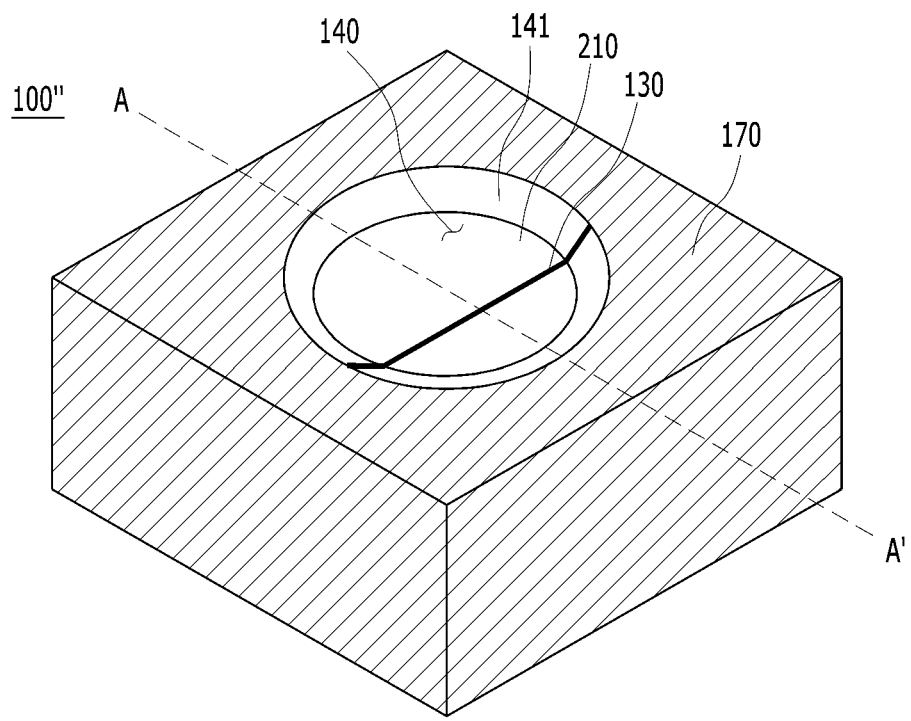
FIG. 7 is a perspective view illustrating a unit substrate for an optical device according to a third embodiment of the present invention.
Figure 8:
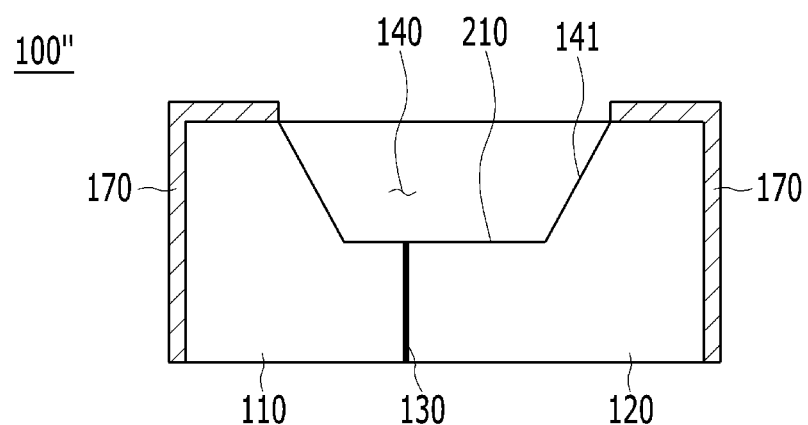
FIG. 8 is a cross-sectional view taken along line A-A' of FIG. 7.

FIG. 7 is a perspective view illustrating a unit substrate for an optical device according to a third embodiment of the present invention; and FIG. 8 is a cross-sectional view taken along line A-A' of FIG. 7.

As shown in FIGS. 7 and 8, the unit substrate 100" for an optical device according to the third embodiment of the present invention differs only in a shape of an upper insulation portion 150, and remaining components are the same as those of the unit substrate 100 of the first embodiment of the present invention.

Thus, same elements may be substituted for the foregoing description, and redundant descriptions are omitted.

As shown in FIG. 7, upper and side surfaces of the unit substrate 100" for an optical device are coated with an insulation material.

In other words, upper and side surfaces of the first and second metal substrates 110 and 120 are provided with an insulating layer by coating with the insulation material.

Here, the inside of the light transmitting member 240 and the light transmitting member 240 provided on the light transmitting member 240 are not coated.

Specifically, the cavity 140 is configured on the upper surfaces of the first and second metal substrates 110 and 120 that are bonded by the vertical insulating layer 130, and a coating layer 170 is formed on the upper and side surfaces of the first and second metal substrates 110 and 120 using the insulating material.

In other words, as shown in FIG. 8, the upper and side surfaces of the first and second metal substrates 110 and 120 are coated with the insulating material such that a thin insulating layer is formed on the upper and side surfaces of the unit substrate 100" for an optical device.

The coating layer 170 is formed on the entire outer surface of the unit substrate 100" for an optical device except the bottom surface thereof such that the vertical insulating layer 130 is not exposed from the outer surface except the cavity 140.

The coating layer 170 formed as described above blocks electricity that may flow from the top and side surfaces of the unit substrate, thereby preventing an electrical short-circuit that may occur in the first and second metal substrates 110 and 120.

As described above, since the entire outer surface of the unit substrate 100" for an optical device according to the third embodiment of the present invention is coated with the insulation material and protected thereby, it is possible to achieve a waterproof structure.

The above-mentioned vertical insulating layer 130, upper insulation portion 150, insulation material filled in the accommodating portion, horizontal insulating layer 151, and coating layer 170 may be made of a material selected from the group consisting of a conventional insulating sheet, benzocyclobutene (BCB), bismaleimide-triazine (BT), poly-benzoxazole (PBC)), polyimide (PI), phenolic resin, epoxy, silicone, and an equivalent material, but not limited thereto.

As described above, the present invention has been described with reference to the preferred embodiments. However, those skilled in the art will appreciate that various modifications, additions and substitutions are possible, without departing from the scope and spirit of the invention as disclosed in the accompanying claims.

What is claimed is:

1. A unit substrate for an optical device, the unit substrate comprising:
   first and second metal substrates bonded to each other with a vertical insulating layer interposed therebetween;
   a cavity provided on first portions of upper surfaces of the bonded first and second metal substrates;
   an optical device-mounting region provided on a bottom surface of the cavity;
   an upper insulation portion provided on second portions of the upper surfaces of the bonded first and second metal substrates; and
   a side insulation portion provided along side surfaces of the bonded first and second metal substrates,
   wherein lower surfaces of the bonded first and second metal substrates are electrically connected to the optical device-mounting region, respectively, and
   wherein the side surfaces and the second portions of the upper surfaces of the bonded first and second metal substrates are electrically isolated from the optical device-mounting region, and
   wherein the side insulation portion surrounds substantially the entire side surfaces of the bonded first and second metal substrates.

2. The unit substrate of claim 1, wherein the side surfaces and the second portions of the upper surfaces of the bonded first and second metal substrates are coated with an insulation material, so as to form the upper insulation portion and the side insulation portion.

3. The unit substrate of claim 1, wherein the upper insulation portion is an insulating member bonded to the upper surfaces of the bonded first and second metal substrates.

4. The unit substrate of claim 1, wherein the upper insulation portion is a metal substrate bonded to the upper surfaces of the bonded first and second metal substrates with a horizontal insulating layer interposed therebetween.

5. The unit substrate of claim 1, wherein the side insulation portion is bonded to the side surfaces of the bonded first and second metal substrates and configured to overlap with the upper insulation portion.

6. The unit substrate of claim 5, wherein the insulating member is an insulation material filled in an accommodating portion configured along a peripheral surface of the bonded first and second metal substrates.

7. The unit substrate of claim 1, wherein the side insulation portion electrically isolates the bonded first and second metal substrates from outside of the unit substrate.

8. The unit substrate of claim 1, wherein the cavity includes an inclined surface and the bottom surface, the inclined surface and the bottom surface of the cavity corresponding to the first portions of the upper surfaces of the bonded first and second metal substrates.

9. An optical device package comprising:
   first and second metal substrates bonded to each other with a vertical insulating layer interposed therebetween;
   a cavity provided on first portions of upper surfaces of the bonded first and second metal substrates;
   an optical device mounted in the cavity;
   an upper insulation portion provided on second portions of the upper surfaces of the bonded first and second metal substrates;
   a side insulation portion provided along side surfaces of the bonded first and second metal substrates; and
   a light transmitting member provided on the cavity,
   wherein lower surfaces of the bonded first and second metal substrates are electrically connected to the optical device, respectively,
   wherein the side surfaces and the second portions of the upper surfaces of the bonded first and second metal substrates are electrically isolated from the optical device, and
   wherein the side insulation portion surrounds substantially the entire side surfaces of the bonded first and second metal substrates.

10. The optical device package of claim 9, further comprising:

a conductor electrically connecting the optical device and the first and second metal substrates across the vertical insulating layer in the cavity, wherein the second portions of the upper surfaces of the bonded first and second metal substrates are insulated by an insulating member, which is bonded to the second portions of the upper surfaces of the bonded first and second metal substrates and serves as the upper insulation portion, wherein the side surfaces of the bonded first and second metal substrates are insulated by the side insulation portion, the side insulation portion being formed in which an insulation material is filled in an accommodating portion configured along a peripheral surface of the bonded first and second metal substrates, and wherein the side insulation portion is configured to overlap with the upper insulation portion.

* * * * *